United States Patent
Shi

(10) Patent No.: US 10,522,078 B2
(45) Date of Patent: Dec. 31, 2019

(54) OLED EXTERNAL COMPENSATION CIRCUIT OF A DEPLETION TYPE TFT

(71) Applicant: Shenzhen China Star Optoelectronics Semiconductor Display Technology Co., Ltd., Shenzhen (CN)

(72) Inventor: Longqiang Shi, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 40 days.

(21) Appl. No.: 15/574,837

(22) PCT Filed: Sep. 15, 2017

(86) PCT No.: PCT/CN2017/101976
§ 371 (c)(1),
(2) Date: Nov. 17, 2017

(87) PCT Pub. No.: WO2019/033494
PCT Pub. Date: Feb. 21, 2019

(65) Prior Publication Data
US 2019/0051252 A1  Feb. 14, 2019

(30) Foreign Application Priority Data

Aug. 14, 2017 (CN) .......................... 2017 1 0693609

(51) Int. Cl.
*G09G 3/3233* (2016.01)
*G09G 3/3258* (2016.01)
*H01L 27/12* (2006.01)

(52) U.S. Cl.
CPC ......... *G09G 3/3233* (2013.01); *G09G 3/3258* (2013.01); *G09G 2320/045* (2013.01); *H01L 27/1214* (2013.01)

(58) Field of Classification Search
CPC .. G09G 3/3208; G09G 3/3233; G09G 3/3258; G09G 2320/045; G09G 3/32–3291
See application file for complete search history.

(56) References Cited

U.S. PATENT DOCUMENTS 8,946,994 B2 * 2/2015 Oh ........................ H05B 37/02
                                                               315/119
9,001,012 B2 * 4/2015 Yumoto ............... G09G 3/3233
                                                               345/76

(Continued)

FOREIGN PATENT DOCUMENTS

CN   102930822 A    2/2013
CN   102982767 A    3/2013

(Continued)

*Primary Examiner* — Gene W Lee
(74) *Attorney, Agent, or Firm* — Leong C. Lei

(57) ABSTRACT

The present invention involves an OLED external compensation circuit of a depletion type TFT. The OLED external compensation circuit of a depletion type TFT comprises a first thin film transistor (T1), a second thin film transistor (T2), a capacitor (Cst), an organic light emitting diode (OLED), and a compensation circuit (10). The second thin film transistor (T2) is a depletion type. The compensation circuit is connected with the first node (S(N)) and the second node (T(N)). A reset signal is inputted into the compensation circuit (10). The present invention further provides another two OLED external compensation circuits of a depletion type TFT. The present invention provides an OLED external compensation circuit suitable for a depletion type TFT in view of the complicated characteristics of the conventional designs of the depletion type TFT and the OLED external compensation. The OLED external compensation circuit of another depletion type TFT of the present invention, which reduces the cost of the system chip, thereby achieving cost reduction. The OLED external compensation circuit of another depletion type TFT of the present invention can be compatible with an enhanced TFT (Vth is positive) circuit.

3 Claims, 5 Drawing Sheets

(56) References Cited

U.S. PATENT DOCUMENTS

| | | | | |
|---|---|---|---|---|
| 9,013,378 B2* | 4/2015 | Yumoto | ............... | G09G 3/3233 345/76 |
| 9,378,673 B2* | 6/2016 | Oh | ............... | H05B 37/02 |
| 9,570,048 B2* | 2/2017 | Yumoto | ............... | G09G 3/3233 |
| 9,734,799 B2* | 8/2017 | Yumoto | ............... | G09G 3/3233 |
| 10,062,330 B2* | 8/2018 | Han | ............... | G09G 3/3258 |
| 10,062,361 B2* | 8/2018 | Yumoto | ............... | G09G 3/3233 |
| 10,083,655 B2* | 9/2018 | Lee | ............... | G09G 3/3233 |
| 10,109,237 B2* | 10/2018 | Park | ............... | G09G 3/3233 |
| 10,140,923 B2* | 11/2018 | Wang | ............... | G09G 3/3233 |
| 2007/0273620 A1* | 11/2007 | Yumoto | ............... | G09G 3/3233 345/76 |
| 2012/0287102 A1* | 11/2012 | Toyomura | ............... | G09G 3/3233 345/211 |
| 2014/0062331 A1* | 3/2014 | Nam | ............... | G09G 3/3233 315/226 |
| 2015/0187273 A1* | 7/2015 | Chang | ............... | G09G 3/3233 345/690 |
| 2015/0379934 A1* | 12/2015 | Xiaoling | ............... | G09G 3/3233 345/214 |
| 2016/0189635 A1* | 6/2016 | Lee | ............... | G09G 3/3233 345/690 |
| 2016/0253961 A1* | 9/2016 | Huangfu | ............... | G09G 3/3225 345/691 |
| 2018/0144717 A1* | 5/2018 | Kim | ............... | G09G 5/10 |
| 2018/0197469 A1* | 7/2018 | Lo | ............... | G09G 3/3233 |
| 2018/0218681 A1* | 8/2018 | Cai | ............... | G09G 3/3275 |
| 2018/0269232 A1* | 9/2018 | Cai | ............... | H01L 27/1214 |
| 2018/0277037 A1* | 9/2018 | Lin | ............... | G09G 3/3233 |

FOREIGN PATENT DOCUMENTS

| | | |
|---|---|---|
| CN | 103915057 A | 7/2014 |
| CN | 103927969 A | 7/2014 |
| CN | 104867441 A | 8/2015 |
| CN | 106328061 A | 1/2017 |

* cited by examiner

US 10,522,078 B2

OLED EXTERNAL COMPENSATION CIRCUIT OF A DEPLETION TYPE TFT

BACKGROUND OF THE INVENTION

Field of Invention

The present invention relates to the field of liquid crystal display, and more particularly to an OLED external compensation circuit of a depletion type TFT.

Description of Prior Art

Organic light Emitting Display (OLED) display device with self-luminous, low driving voltage, high luminous efficiency, short response time, sharpness and contrast, nearly 180°viewing angle, the use of a wide temperature range, flexible display, large area full color display and many other advantages, the industry is recognized as the most development potential of the display device.

FIG. 1 is an illustrative diagram of a conventional 2T1C OLED driving circuit. The conventional OLED driving circuit is composed of 2T1C, that is, a structure with two thin film transistors (TFT) plus a capacitor, to convert the voltage to the current, T1 is a switch TFT, used to control the entering of the data signal Vdata, T2 is a driving TFT, used to control the current through the OLED, Cst is a storage capacitor. Due to prolonged operation, T2 is under severe voltage stress and the threshold voltage Vth will shift. According to the known formula of current, $Ids=\beta/2 (Vgs-Vth)^2$, when Vdata is the same, the change of Vth will inevitably lead to the change of Ids. Because the OLED is a current-driving drive, it inevitably affects the brightness of the OLED, which affects the normal display. In order to solve this problem, one idea is to introduce an internal compensation circuit that counteracts the effect of the Vth shift. But the conventional compensation circuit is more complex, the number of TFT is generally more than 5. So many TFTs will occupy a lot of space, and it will inevitably affect the pixel area of the opening area, which is not beneficial for high aperture and high-resolution display design.

The IGZO (indium gallium zinc oxide)-TFT with BCE (Back-channel-etch) structure is the hotspot of the present research. However, the current performance of the IGZO-TFT is mostly as depletion type TFT, that is, the threshold voltage (Vth) is negative. The transfer characteristic curve of the depleted IGZO-TFT is shown in FIG. 2, where the horizontal axis is the voltage (volts) and the vertical axis is the current (amperes). Due to the characteristics of the depleted IGZO-TFT, the circuit design is more complex.

SUMMARY OF THE INVENTION

Therefore, an object of the present invention to provide an OLED external compensation circuit for a depletion type TFT for the complicated characteristics of the conventional designs of the depletion type TFT and the OLED external compensation.

In order to achieve the object, the present invention provides an OLED external compensation circuit of a depletion type TFT, which comprises a first thin film transistor, a second thin film transistor, a capacitor, an organic light emitting diode, and a compensation circuit. The second thin film transistor is a depletion type. A gate electrode of the first thin film transistor is inputted with a gate line signal. A source electrode and a drain electrode of the first thin film transistor are respectively inputted with a data signal and connected with a first node. A gate of the second thin film transistor is connected with the first node. A source electrode and a drain electrode of the second thin film transistor are respectively inputted with a DC high voltage power supply and connected with a second node. Both ends of the capacitor are connected with at the first node and the second node. A positive electrode of the organic light emitting diode is connected with the second node and the negative electrode of the organic light emitting diode is grounded. The compensation circuit is connected with the first node and the second node. An AC reset signal is inputted to the compensation circuit. The AC reset signal is turned on at a blanking time of each frame when an OLED display device displays an image, and is turned off when normally operated on each frame. When the AC reset signal is turned on, the compensation circuit changes the voltages of the first node and the second node.

Wherein the compensation circuit comprises a third thin film transistor. A gate electrode of the third thin film transistor is inputted with the AC reset signal. A source electrode and a drain electrode of the third thin film transistor are respectively inputted with a DC reference potential and connected with the first node and the second node at the same time.

During Operation:

In the first stage, the AC reset signal is at a high potential at which time the third thin film transistor is turned on and a signal of the DC reference potential is written to the first node and the second node.

In the second stage, the gate line signal and the AC reset signal are at a low potential, the first thin film transistor and the third thin film transistor are turned off and the second thin film transistor is still turned on.

In the third stage, when the gate line signal is at a high potential, the first thin film transistor is turned on and the data signal is written to the first node.

The present invention further provides another OLED external compensation circuit of a depletion type TFT, which comprises a first thin film transistor, a second thin film transistor, a capacitor, an organic light emitting diode, and a compensation circuit. The second thin film transistor is a depletion type. A gate electrode of the first thin film transistor is inputted with a gate line signal. A source electrode and a drain electrode of the first thin film transistor are respectively inputted with a data signal and connected with a first node. A gate of the second thin film transistor is connected with the first node. A source electrode and a drain electrode of the second thin film transistor are respectively inputted with a DC high voltage power supply and connected with a second node. Both ends of the capacitor are connected with at the first node and the second node. A positive electrode of the organic light emitting diode is connected with the second node and the negative electrode of the organic light emitting diode is grounded. The compensation circuit is connected with the first node and the second node. An AC reference potential is inputted to the compensation circuit. The AC reference potential is turned on at a blanking time of each frame when an OLED display device displays an image, and is turned off when normally operated on each frame. When the AC reference potential is turned on, the compensation circuit changes the voltages of the first node and the second node.

Wherein the compensation circuit comprises a third thin film transistor and a fourth thin film transistor. A gate electrode of the third thin film transistor is inputted with the AC reference potential. A source electrode and a drain electrode of the third thin film transistor are respectively connected with a drain electrode/source electrode of the fourth thin film transistor and connected with the first node and the second node at the same time. A gate electrode of the fourth thin film transistor is inputted with the AC reference potential.

During Operation:

In the first stage, the AC reference potential is at a high potential at which time the third thin film transistor and the fourth thin film transistor are turned on and a signal of the AC reference potential is written to the first node and the second node.

In the second stage, the gate line signal and the AC reference potential are at a low potential, the first thin film transistor, the third thin film transistor, and the fourth thin film transistor are turned off and the second thin film transistor is still turned on.

In the third stage, when the gate line signal is at a high potential, the first thin film transistor is turned on and the data signal is written to the first node.

The present invention further provides still another OLED external compensation circuit of a depletion type TFT, which comprises a first thin film transistor, a second thin film transistor, a capacitor, an organic light emitting diode, and a compensation circuit. The second thin film transistor is a depletion type. A gate electrode of the first thin film transistor is inputted with a gate line signal. A source electrode and a drain electrode of the first thin film transistor are respectively inputted with a data signal and connected with a first node. A gate of the second thin film transistor is connected with the first node. A source electrode and a drain electrode of the second thin film transistor are respectively inputted with a DC high voltage power supply and connected with a second node. Both ends of the capacitor are connected with at the first node and the second node. A positive electrode of the organic light emitting diode is connected with the second node and the negative electrode of the organic light emitting diode is grounded. The compensation circuit is connected with the first node and the second node. A first AC reference potential and a second AC reference potential are inputted to the compensation circuit. The first AC reference potential and the second AC reference potential are turned on at a blanking time of each frame when an OLED display device displays an image, and are turned off when normally operated on each frame. When the first AC reference potential and the second AC reference potential are turned on. The compensation circuit changes the voltages of the first node and the second node.

Wherein the compensation circuit comprises a third thin film transistor and a fourth thin film transistor. A gate electrode of the third thin film transistor is inputted with the first AC reference potential. A source electrode and a drain electrode of the third thin film transistor are respectively inputted with the first AC reference potential and connected with the first node. A gate electrode of the fourth thin film transistor is inputted with the first AC reference potential. A source electrode and a drain electrode of the fourth thin film transistor are respectively inputted with the second AC reference potential and connected with the second node.

During Operation:

In the first stage, the first AC reference potential and the second AC reference potential are at a high potential at which time the third thin film transistor and the fourth thin film transistor are turned on, a signal of the first AC reference potential is written to the first node and a signal of the second AC reference potential is written to the second node.

In the second stage, the gate line signal and the first AC reference potential are at a low potential, the first thin film transistor, the third thin film transistor, and the fourth thin film transistor are turned off and the second thin film transistor is still turned on.

In the third stage, when the gate line signal is at a high potential, the first thin film transistor is turned on and the data signal is written to the first node.

In summary, the present invention provides an OLED external compensation circuit suitable for a depletion type TFT in view of the complicated characteristics of the conventional designs of the depletion type TFT and the OLED external compensation. The OLED external compensation circuit of another depletion type TFT of the present invention, which reduces the cost of the system chip, thereby achieving cost reduction. The OLED external compensation circuit of another depletion type TFT of the present invention can be compatible with an enhanced TFT (Vth is positive) circuit.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

Figure 1:
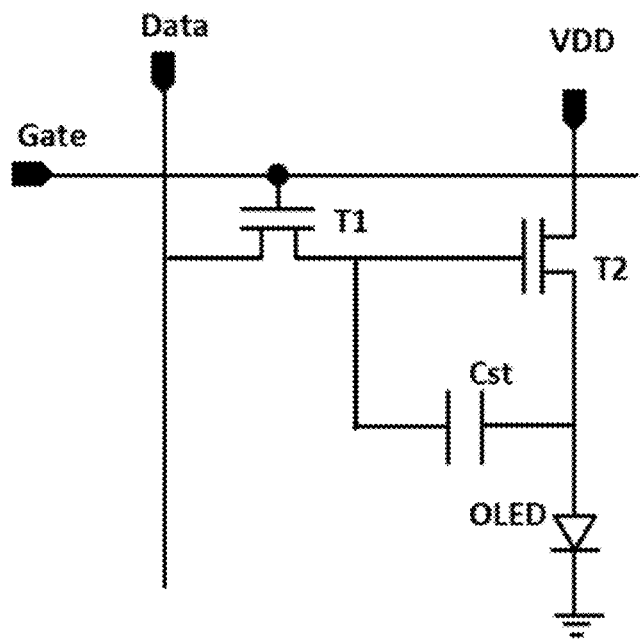
FIG. 1 is an illustrative diagram of an OLED driving circuit of 2T1C according to the conventional art.
Figure 2:
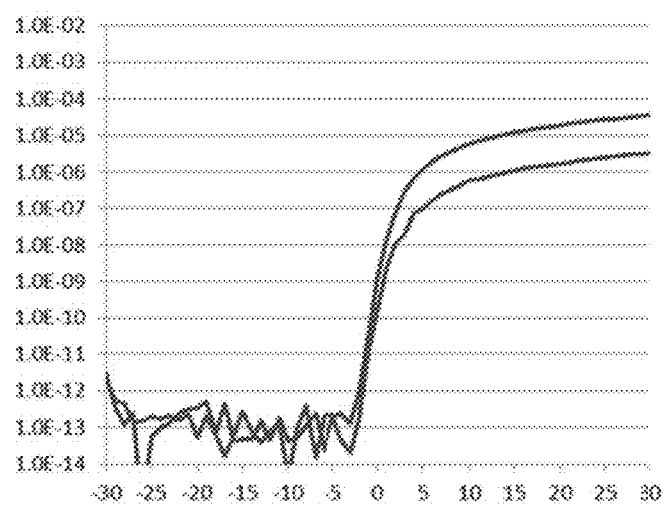
FIG. 2 is a transfer characteristic curve of a depletion type IGZO-TFT.
Figure 3:
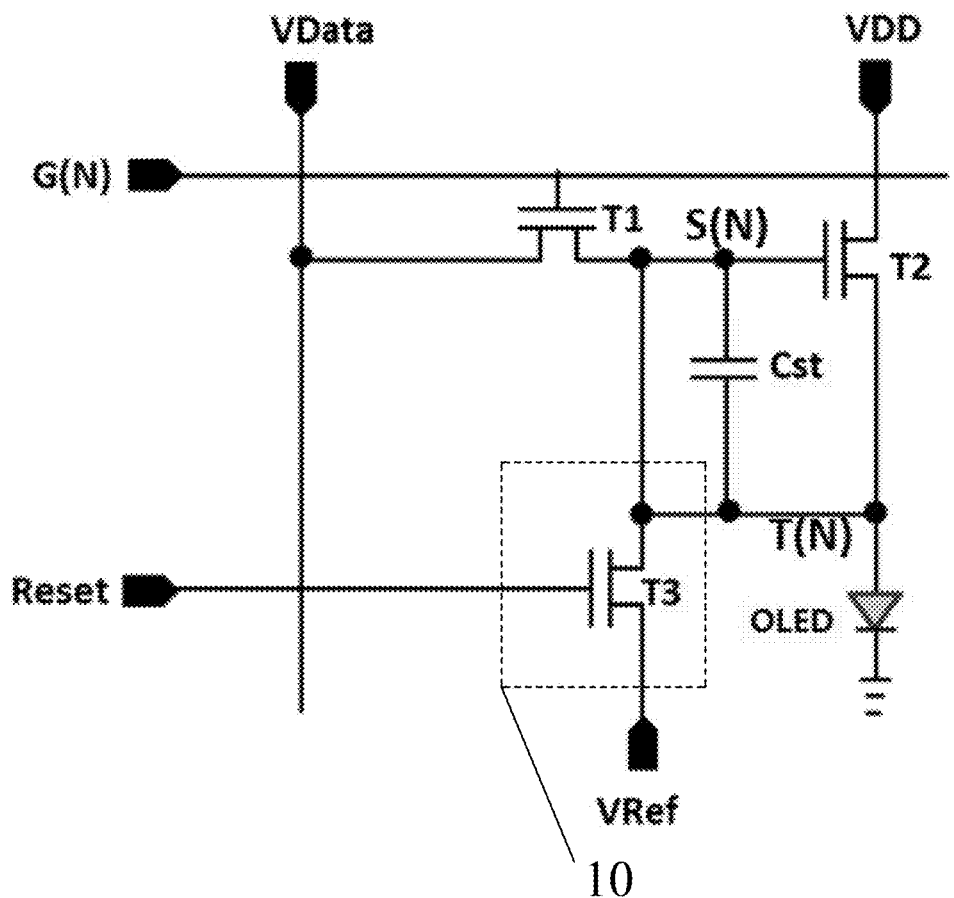
FIG. 3 is a schematic diagram of an OLED external compensation circuit of a first depletion type TFT according to the present invention.

FIG. 3 is a first external compensation circuit according to the present invention. The circuit is composed of three TFTs and one Cst, the main difference with the conventional external compensation circuit is the compensation circuit 10, which comprises a thin film transistor T3. A gate electrode of the thin film transistor is inputted with an AC reset signal Reset. A source electrode and a drain electrode of the thin film transistor are respectively inputted with a DC reference potential Vref and connected with the node S (N) and the node T (N) simultaneously. Vdata is the data signal. G (N) is the signal corresponding to any gate line. The high potential is 28V and the low potential is −7V. VDD is a direct current (DC) high voltage power supply; the potential is generally set to be 28V. Vref is the reference potential, which is less than the DC high voltage power supply of the VDD, the potential is generally set to 5V. The Reset signal Reset is AC, the high potential is 28V and the low potential is −7V.

The depletion TFT of the present invention may be IGZO-TFT.

Figure 4:
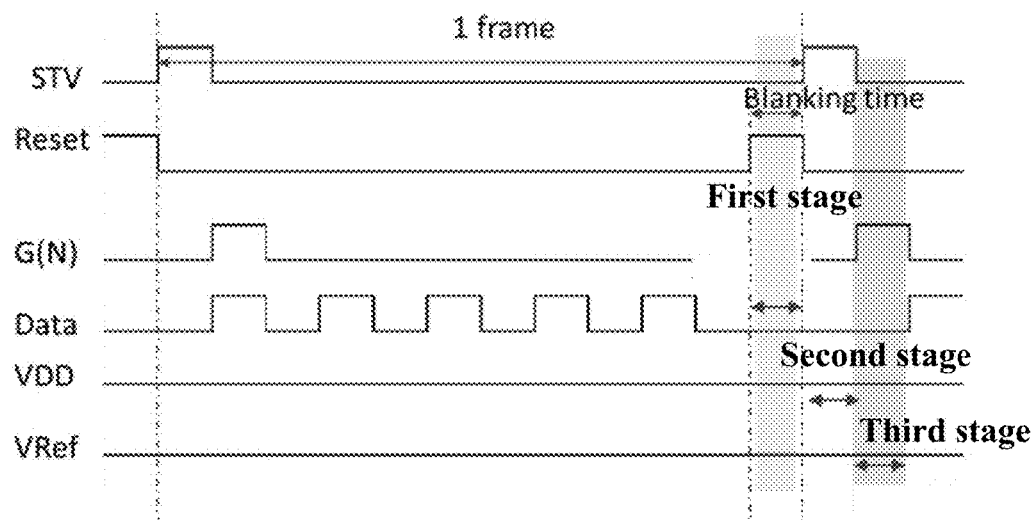
FIG. 4 is a waveform diagram of an OLED external compensation circuit of the first depletion type TFT according to the present invention.

FIG. 4 is a drawing of the corresponding waveform, which illustrate the correspondence between signals. STV is a trigger signal, and the time from the first STV to the second STV is used to define a frame time, the STV signal of the OLED display device is introduced to help understand the operation of the compensation circuit. The reset signal Reset starts in the blanking time of each frame and closes when each frame normally works. The blanking time refers to the interval between the end of the n-th frame image signal and the start of the (n+1)th frame image signal of the OLED display device.

The working status is described as below:
The First Stage:
Blanking time phase, at this stage, Reset is at the high potential, then T3 is opened, signal of Vref is written to S (N) and T (N), potential of sides of the gate electrode and the source electrode of the TFT T2 are rewritten to the potential of Vref, and all the TFTs are homered. At this moment, Vgs=Vg−Vs=V_S(N)−V_T(N)=Vref−Vref=0.

The second stage: Vth extraction phase. At this time, the potential of G (N) and Reset are at low potentials, T1 and T3 are closed. Since it is a depletion type TFT (Vth<0), T2 is still at the open phase.

Vds=VDD−T(N). Since Vgs=0<<Vds, T2 is at the saturation phase. So at the final equilibrium stage, Vgs=Vth, and Vs=Vg−Vth=Vref−Vth.

The third stage: Vth compensation phase. When G (N) is on and T1 is on, the signal Vdata of data is written to node S (N). At T2, Vgs=V_S (N)−V_T (N)=Vdata−(Vref−Vth)=Vdata−Vref+Vth.

At this time, the current is independent from Vth according to the saturation current formula Ids=β/2(Vgs−Vth)^=β/2(Vdata−Vref+Vth−Vth)^=β/2(Vdata−Vref), to get a good compensation.

Figure 5:
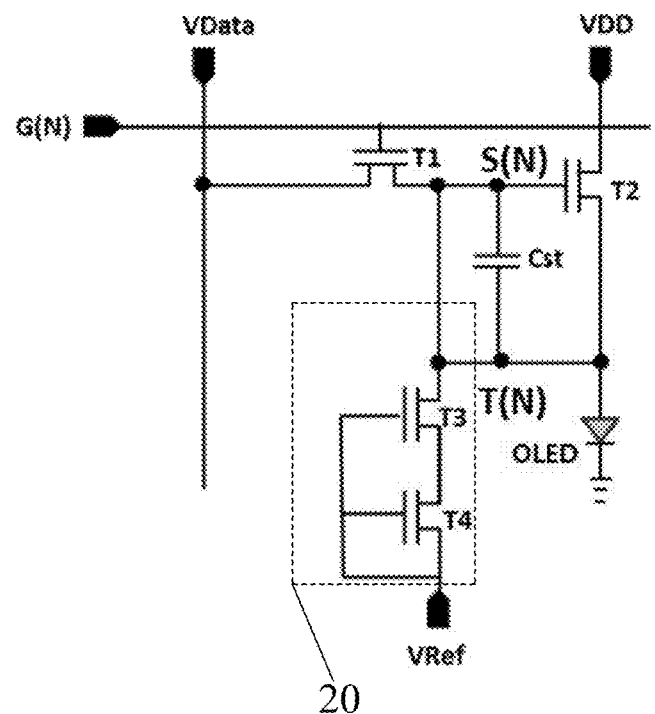
FIG. 5 is a schematic diagram of an OLED external compensation circuit of a second depletion type TFT according to the present invention.

FIG. 5 is a second external compensation circuit according to the present invention. The circuit is composed of four TFTs and one Cst. The compensation circuit 20 includes a thin film transistor T3 and a thin film transistor T4. A gate electrode of T3 is inputted with the AC reference potential Vref, a source electrode and a drain electrode of T3 are connected with a source/drain electrode of the T4, the node S (N) and the node T N) at the same time. A gate electrode of T4 is inputted with the AC reference potential Vref and the other source/drain electrodes of T4 are also inputted with the AC reference potential Vref Vdata is the data signal. G (N) is the signal corresponding to any gate line. The high potential is 28V and the low potential is −7V. VDD is a direct current (DC) high voltage power supply, the potential is generally set to be 28V. Vref is the reference potential, which is an AC power supply, the high potential is 28V and the low potential is −7V.

Figure 6:
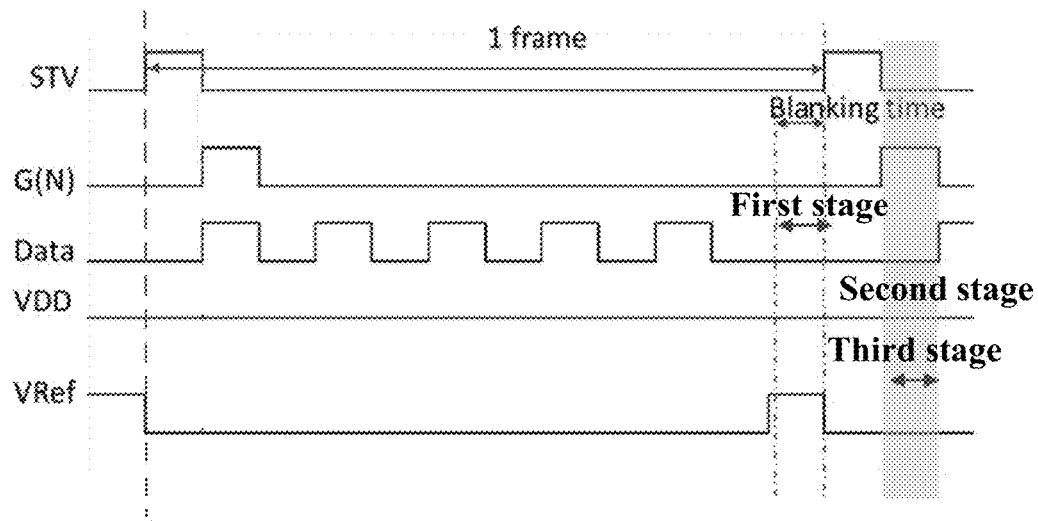
FIG. 6 is a waveform diagram of an OLED external compensation circuit of the second depletion type TFT according to the present invention.

FIG. 6 is a drawing of the corresponding waveform, which illustrate the correspondence between signals. STV is a trigger signal, and the time from the first STV to the second STV is used to define a frame time. The Vref starts in the blanking time of each frame and closes when each frame normally works.

Compared with the first external compensation circuit, the second circuit increases with a TFT and increases the space, but eliminates the need for a Reset signal, reducing the cost of the integrated chip (IC), in order to achieve cost reduction.

The working status is described as below:
The First Stage:
Blanking time phase, at this stage, Vref is at the high potential, then T3 and T4 are opened, signal of Vref is written to S (N) and T (N), potential of sides of the gate electrode and the source electrode of the TFT T2 are rewritten to the potential of Vref, and all the TFTs are homered. At this moment, Vgs=Vg−Vs=V_S(N)−V_T(N)=Vref−Vref=0.

The second stage: Vth extraction phase. At this time, the potential of G (N) and Vref are at low potentials, T1, T3, and T4 are closed. Since it is a depletion type TFT (Vth<0), T2 is still at the open phase.

Vds=VDD−T(N). Since Vgs=0<<Vds, T2 is at the saturation phase. So at the final equilibrium stage, Vgs=Vth, and Vs=Vg−Vth=Vref−Vth.

The third stage: Vth compensation phase. When G (N) is on and T1 is on, the signal Vdata of data is written to node S (N). At T2, Vgs=V_S (N)−V_T (N)=Vdata−(Vref−Vth)=Vdata−Vref+Vth.

At this time, the current is independent from Vth according to the saturation current formula Ids=β/2(Vgs−Vth)^=β/2(Vdata−Vref+Vth−Vth)^=β/2(Vdata−Vref), to get a good compensation.

Figure 7:
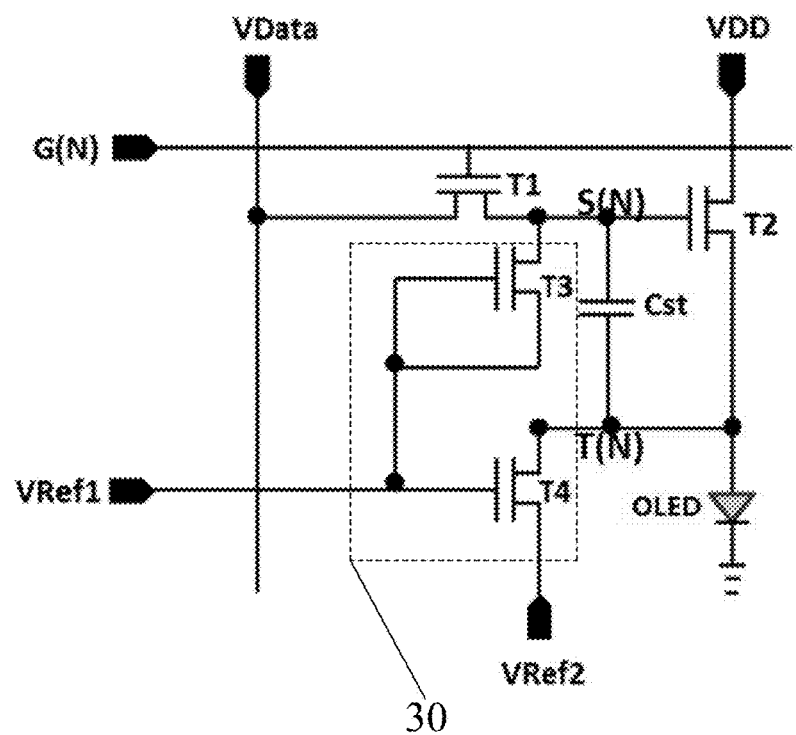
FIG. 7 is a schematic diagram of an OLED external compensation circuit of a third depletion type TFT according to the present invention.

FIG. 7 is a third external compensation circuit according to the present invention. The circuit is composed of four TFTs and one Cst. The compensation circuit 30 includes thin film transistors T3, T4. A gate electrode of T3 is inputted with the AC reference potential Vref1, a source electrode and a drain electrode of T3 are respectively inputted with the AC reference potential Vref and connected with the node S (N). A gate electrode of T4 is inputted with the AC reference potential Vref1. A source electrode and a drain electrode of T4 are respectively also inputted with the AC reference potential Vref2 and connected with the node T(N). Vdata is the data signal. G (N) is the signal corresponding to any gate line. The high potential is 28V and the low potential is −7V. VDD is a direct current (DC) high voltage power supply; the potential is generally set to be 28V Vref1 and Vref2 are both the reference potential, which is an AC power supply, the high potential is 28V and the low potential is −7V. The voltage difference between Vref1 and Vref2 is adjustable.

Figure 8:
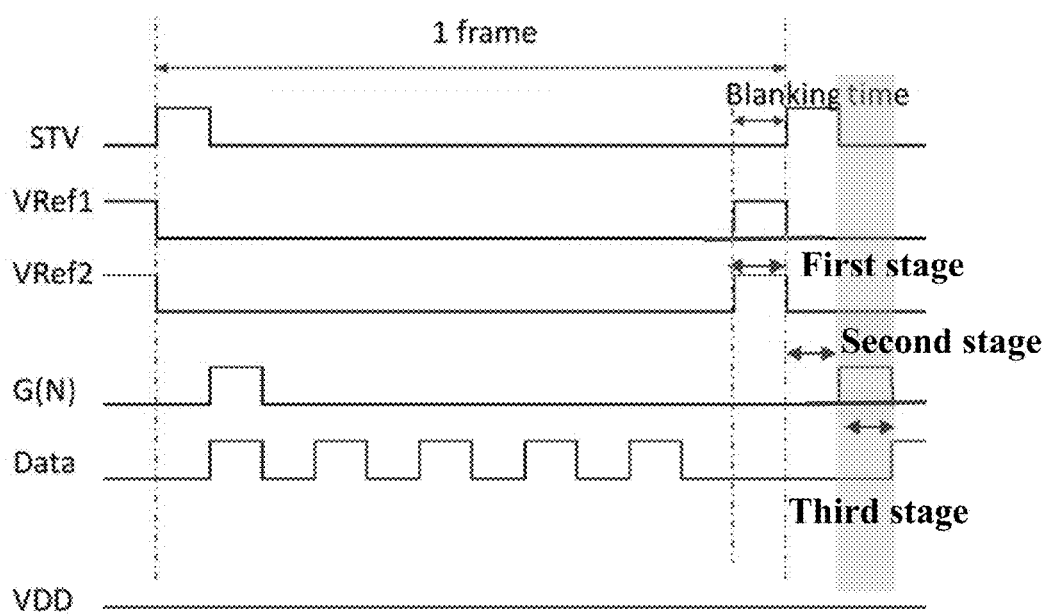
FIG. 8 is a waveform diagram of an OLED external compensation circuit of the third depletion type TFT according to the present invention.

FIG. 8 is a drawing of the corresponding waveform, which illustrate the correspondence between signals. STV is a trigger signal, and the time from the first STV to the second STV is used to define a frame time. The Vref starts in the blanking time of each frame and closes when each frame normally works.

Compared with the previous two circuits, it is characterized that the voltage difference between Vref1 and Vref2 is adjustable. The circuit can be compatible with enhanced TFT (Vth is positive) circuit.

The working status is described as below:
The First Stage:
Blanking time phase, at this stage, Vref1 and Vref2 are at the high potential, then T3 and T4 are opened, signal of Vref1 is written to T (N), in other words, potential of sides of the gate electrode and the source electrode of the TFT T2 are respectively rewritten to the potentials of Vref1 and Verf2, and all the TFTs are homered. At this moment, Vgs=Vg−Vs=V_S(N)−V_T(N)=Vref1−Vref2=0.

If the TFT is depletion type, Vth<0, Vgs=Vref1−Vref2 can be set to be less than or equal to 0 and greater than Vth.

If the TFT is enhancement type, Vth>0, Vgs=Vref1−Vref2 can be set to be greater than or equal to 0 and greater than Vth.

The second stage: Vth extraction phase. At this time, the potential of G (N) and Vref1 are at low potentials, T1, T3, and T4 are closed. For the setting of Vref1 and Vref2 is ensured that Vgs=Vref1−Vref2>=Vth, T2 is still at the open phase.

Vds=VDD−T(N). Since Vgs=Vref1−Vref2>=Vth, T2 is at the saturation phase. So at the final equilibrium stage, Vgs=Vth, and Vs=Vg−Vth=Vref1−Vth.

The third stage: Vth compensation phase. When G (N) is on and T1 is on, the signal Vdata of data is written to node S (N). At T2, Vgs=V_S (N)−V_T (N)=Vdata−(Vref1−Vth)= Vdata−Vref1+Vth.

At this time, the current is independent from Vth according to the saturation current formula Ids=β/2(Vgs−Vth)^=β/2(Vdata−Vref1+Vth−Vth)^=β/2(Vdata−Vref1), to get a good compensation.

In summary, the present invention provides an OLED external compensation circuit suitable for a depletion type TFT in view of the complicated characteristics of the conventional designs of the depletion type TFT and the OLED external compensation. The OLED external compensation circuit of another depletion type TFT of the present invention, which reduces the cost of the system chip, thereby achieving cost reduction. The OLED external compensation circuit of another depletion type TFT of the present invention can be compatible with an enhanced TFT (Vth is positive) circuit.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:

1. An OLED external compensation circuit of a depletion type TFT, comprising a first thin film transistor, a second thin film transistor, a capacitor, an organic light emitting diode, and a compensation circuit, the second thin film transistor being a depletion type, a gate electrode of the first thin film transistor being inputted with a gate line signal, a source electrode and a drain electrode of the first thin film transistor being respectively inputted with a data signal and connected with a first node; a gate of the second thin film transistor being connected with the first node, a source electrode and a drain electrode of the second thin film transistor being respectively inputted with a DC high voltage power supply and connected with a second node, both ends of the capacitor being connected with at the first node and the second node; a positive electrode of the organic light emitting diode being connected with the second node and the negative electrode of the organic light emitting diode being grounded; the compensation circuit being connected with the first node and the second node, and a first AC reference potential and a second AC reference potential being inputted to the compensation circuit; the first AC reference potential and the second AC reference potential being turned on at a blanking time of each frame when an OLED display device displays an image, and being turned off when normally operated on each frame; when the first AC reference potential and the second AC reference potential being turned on, the compensation circuit changing the voltages of the first node and the second node;

wherein the compensation circuit comprises a third thin film transistor and a fourth thin film transistor, a gate electrode of the third thin film transistor is inputted with the first AC reference potential, a source electrode and a drain electrode of the third thin film transistor are respectively inputted with the first AC reference potential and connected with the first node, a gate electrode of the fourth thin film transistor is inputted with the first AC reference potential, and a source electrode and a drain electrode of the fourth thin film transistor are respectively inputted with the second AC reference potential and connected with the second node.

2. The OLED external compensation circuit of a depletion type TFT according to claim 1, wherein during operation:

in the first stage, the first AC reference potential and the second AC reference potential are at a high potential at which time the third thin film transistor and the fourth thin film transistor are turned on, a signal of the first AC reference potential is written to the first node and a signal of the second AC reference potential is written to the second node;

in the second stage, the gate line signal and the first AC reference potential are at a low potential, the first thin film transistor, the third thin film transistor, and the fourth thin film transistor are turned off and the second thin film transistor is still turned on;

in the third stage, when the gate line signal is at a high potential, the first thin film transistor is turned on and the data signal is written to the first node.

3. The OLED external compensation circuit of a depletion type TFT according to claim 1, wherein a voltage difference between the first AC reference potential and the second AC reference potential is adjustable.

* * * * *